United States Patent
Moriwaki

(10) Patent No.: US 8,426,867 B2
(45) Date of Patent: Apr. 23, 2013

(54) THIN FILM CAPACITOR, AND DISPLAY DEVICE AND MEMORY CELL EMPLOYING THE SAME, AND MANUFACTURING METHODS OF THEM

(75) Inventor: Hiroyuki Moriwaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 665 days.

(21) Appl. No.: 12/600,499

(22) PCT Filed: Jul. 2, 2008

(86) PCT No.: PCT/JP2008/061981
§ 371 (c)(1),
(2), (4) Date: Nov. 17, 2009

(87) PCT Pub. No.: WO2009/022503
PCT Pub. Date: Feb. 19, 2009

(65) Prior Publication Data
US 2010/0149853 A1    Jun. 17, 2010

(30) Foreign Application Priority Data
Aug. 10, 2007    (JP) .................................. 2007-210339

(51) Int. Cl.
*H01L 29/40* (2006.01)
*H01L 29/94* (2006.01)

(52) U.S. Cl.
USPC .............. 257/72; 257/68; 257/296; 257/306; 257/E29.112; 257/E29.345

(58) Field of Classification Search .................. 365/149; 257/68, 72, 296, 306, 307, 308, E29.112, 257/E29.345
See application file for complete search history.

(56) References Cited

U.S. PATENT DOCUMENTS

| 5,299,155 | A | 3/1994 | Yanagi |
| 6,380,560 | B1 | 4/2002 | Yamazaki |
| 2002/0117736 | A1 | 8/2002 | Yamazaki |
| 2004/0125332 | A1* | 7/2004 | Choi .............................. 349/190 |

(Continued)

FOREIGN PATENT DOCUMENTS

| JP | 61-264740 | 11/1986 |
| JP | 05-323375 | 12/1993 |

(Continued)

OTHER PUBLICATIONS

International Search Report for PCT/JP2008/061981, mailed Aug. 26, 2008.

*Primary Examiner* — Allison P Bernstein
(74) *Attorney, Agent, or Firm* — Nixon & Vanderhye P.C.

(57) ABSTRACT

A plurality of thin film capacitor parts are provided in respective regions each surrounded by a plurality of gate metal lines (12) and a plurality of data signal lines (11) intersecting perpendicularly to each other on a glass substrate (1), and each of the thin film capacitor parts has a lower electrode (3), a gate insulating film, and an upper electrode (5), which are provided in this order. Adjacent upper electrodes (5) are electrically connected to each other via a corresponding first wire (8), which is positioned above the adjacent upper electrodes (5) and intersects with one of the data signal lines (11). This makes it possible to provide a thin film capacitor, which includes the lower electrodes (3) each having the same thickness in a center portion and an edge portion, and the upper electrodes (5) that are connected to each other by using a corresponding connecting wire with low possibility of disconnection.

20 Claims, 10 Drawing Sheets

U.S. PATENT DOCUMENTS

2004/0164300 A1    8/2004    Yamazaki
2007/0171318 A1*   7/2007    Lai .................................. 349/42
2007/0229420 A1*   10/2007   Hwang ........................... 345/87

FOREIGN PATENT DOCUMENTS

| | | |
|---|---|---|
| JP | 09-148537 | 6/1997 |
| JP | 09-160075 | 6/1997 |
| JP | 09-321251 | 12/1997 |
| JP | 9-321251 A | 12/1997 |
| JP | 2003-110019 | 4/2003 |
| JP | 2004-221358 | 8/2004 |
| JP | 2004-264726 | 9/2004 |
| JP | 2005-084104 | 3/2005 |
| JP | 2005-202254 | 7/2005 |

\* cited by examiner

F I G. 4
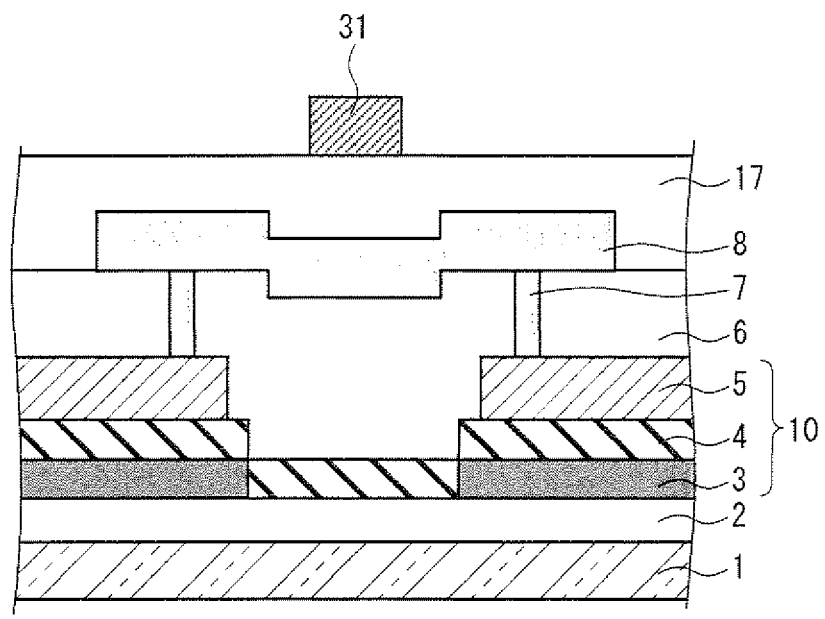

F I G. 6
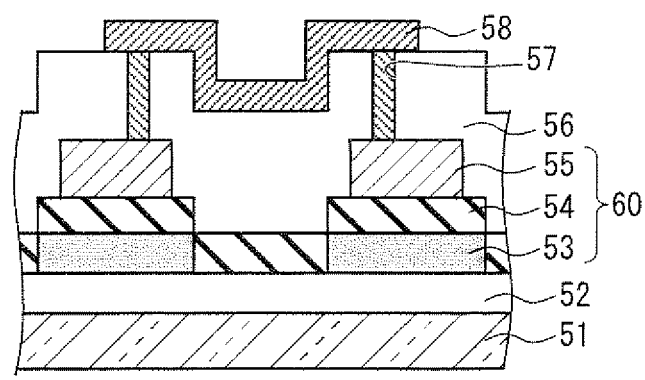

THIN FILM CAPACITOR, AND DISPLAY DEVICE AND MEMORY CELL EMPLOYING THE SAME, AND MANUFACTURING METHODS OF THEM

This application is the U.S. national phase of International Application No. PCT/JP2008/061981, filed 2 Jul. 2008, which designated the U.S. and claims priority to Japanese Patent Application No. 2007-210339, filed 10 Aug. 2007, the entire contents of each of which are hereby incorporated by reference.

TECHNICAL FIELD

The present invention relates to a thin film capacitor including thin film capacitor parts each of which includes a lower electrode, an insulating layer, and an upper electrode, which are provided on a substrate; a display device including the thin film capacitor; a memory cell including the thin film capacitor; and manufacturing methods of the thin film capacitor, the display device, and the memory cell.

BACKGROUND ART (a) of FIG. 7 is a plan view illustrating pixel auxiliary capacitor parts (thin film capacitor parts) and a peripheral circuit of a conventional liquid crystal display device. (b) of FIG. 7 is a cross-sectional view taken along line X-X of (a) of FIG. 7.

As illustrated in (a) and (b) of FIG. 7, a liquid crystal display device has conventionally employed a number of thin film elements as pixel auxiliary capacitor parts (thin film capacitor parts) 110, each of which film elements includes a lower electrode 101, an insulating layer 102, and an upper electrode 103, which are provided on a substrate.

Not only a liquid crystal display device, but also a data storage memory cell includes the thin film capacitor parts. For example, Patent Literature 1 discloses a dynamic random access memory including lower capacitor electrodes 151 (lower electrodes); an insulating layer (not illustrated); and upper capacitor electrodes 152 (upper electrodes), which are provided on a substrate (see FIG. 8).

Meanwhile, in a case where the thin film capacitor parts illustrated in (a) and (b) of FIG. 7, each of which includes the lower electrode 101, the insulating film 102, and the upper electrode 103, are provided in pixels adjacent to each other across a corresponding source metal wire in such a manner that they partly shares a same structure with each other, the thin film capacitor parts are configured such that in a case where upper electrodes 103 of each of the pixels are connected to each other with a wire serving as a layer of the electrodes 103, edge portions 101a of lower electrodes 101, which edge portions 101a are opposed to each other in a region where the corresponding source metal wire is provided, are covered with the insulating film 102 and the wire.

In such a configuration, there has been the following problem. The insulating layer 102 and the wire are stepped in the edge portions 101a of the lower electrodes 101. As a result, the insulating layer 102 cannot sufficiently cover the lower electrodes 101 in the stepped regions. This results in a decrease in voltage resistance, and thus causes an insulation breakdown in a capacitor part to which high voltage is applied. The insulation breakdown leads to a leakage between the upper electrodes 103 and the lower electrodes 101.

This problem is specifically disclosed also in, for example, Patent Literature 2. (a) to (h) of FIG. 9 show a conventional manufacturing process drawing disclosed in Patent Literature 2.

More specifically, Patent Literature 2 describes that a first-layer polysilicon gate electrode 201, which is vertically etched, and a second gate oxide film 202, which is provided on the first-layer polysilicon gate electrode 201 by thermal oxidation, tend to swell outwards (part B in (e) of FIG. 9), and the second gate oxide film 202 tends to be extremely thin in the vicinity (part B' in (e) of FIG. 9) of a first gate oxide film 203 due to for example inner skewness caused by a thermal stress.

Patent Literature 2 further discloses the following problem. As illustrated in (f) of FIG. 9, a second-layer polysilicon film of approximately 3000 Å in thickness is formed on the second gate oxide films 202 and 202' by an LPCVD method, and then phosphorus diffusion is performed, so that the second-layer polysilicon film turns into a second-layer polysilicon gate electrode 204. Here, an edge portion of the second-layer polysilicon gate electrode 204 is overhanged (part C in (f) of FIG. 9) due to effects of a swelled part (part B) and a thin part (part B') shown in (f) of FIG. 9. This makes it difficult to ensure a sufficient voltage resistance between the first-layer polysilicon gate electrode 201 and the second-layer polysilicon gate electrode 204 in part B and part B' of FIG. 9, and as a result, a voltage breakdown occurs. The voltage breakdown leads to a leakage between the first-layer polysilicon gate electrode 201 and the second-layer polysilicon gate electrode 204.

In order to solve the problem, Patent Literature 2 discloses an arrangement in which an edge portion of the first-layer polysilicon gate electrode 201 is etched so that the edge portion tapers off (see (a) to (h) of FIG. 10). With the arrangement, the second gate oxide film 202 has a smooth surface with no overhang. As a result, the second gate oxide film 202 sufficiently covers the first-layer polysilicon gate electrode 201, thereby ensuring a sufficient voltage resistance between the first-layer polysilicon gate electrode 201 and the second-layer polysilicon gate electrode 204.

Patent Literature 3 discloses a liquid crystal display element in which auxiliary capacitor wires are provided all over a liquid crystal display device in a mesh manner so as to reduce an adverse effect associated with disconnection of the auxiliary capacitor wires.

Patent Literature 4 discloses a configuration in which gate lines and auxiliary capacitor lines are arranged such that (i) the gate lines and the auxiliary capacitor lines each have a two-layer structure made of Cr and ITO in a region other than a region where the gate lines and the auxiliary capacitor lines intersect with, not in a same layer (cross over), lines provided around each display region and (ii) the ITO lines are exposed in contact holes.

Patent Literature 5 discloses a configuration in which horizontal signal lines and vertical signal lines are intersecting with each other in such a manner that each of the horizontal signal lines continuously extends whereas each of the vertical signal lines breaks at a corresponding intersection of the horizontal signal lines and, the vertical signal lines, and vertical signal lines thus broken are connected to each other with another wire layer provided in a layer positioned above the corresponding intersection of the horizontal signal lines and vertical signal lines. With the configuration, disconnection of the vertical signal lines and of the horizontal signal lines is prevented, thereby enhancing reliability of signal lines.

Citation List

Patent Literature 1

Japanese Patent Application Publication, Tokukaihei, No. 4-274359 A (Publication Date: Sep. 30, 1992)

Patent Literature 2

Japanese Patent Application Publication, Tokukaisho, No. 61-264740 A (Publication Date: Nov. 22, 1986)

Patent Literature 3

Japanese Patent Application Publication, Tokukaihei, No. 9-160075 A (Publication Date: Jun. 20, 1997)

Patent Literature 4

Japanese Patent Application Publication, Tokukaihei, No. 5-323375 A (Publication Date: Dec. 7, 1993)

Patent Literature 5

Japanese Patent Application Publication, Tokukai, No. 2003-110019 A (Publication Date: Apr. 11, 2003)

SUMMARY OF INVENTION

However, in the case where the conventional thin film capacitor parts are arranged such that the edge portion of the first-layer polysilicon gate electrode 201 (the lower electrode) tapers off as in Patent Literature 2, the lower electrode is different in thickness at a center portion and at the edge portion thereof. This causes a difference in a doping concentration in the lower electrode. As a result, a threshold characteristic of the lower electrode is different between the edge portion and the center portion, thereby causing a deterioration in the threshold characteristic. Even with the arrangement in which the auxiliary capacitor wires are provided in the mesh manner (refer to Patent Literature 3), the same problem as described in Patent Literature 1 occurs. Patent Literatures 4 and 5 mention neither the problem of the disconnection of the thin film capacitor parts nor means for solving the problem.

The present invention has been made in view of the conventional problems, and an object thereof is to provide (i) a thin film capacitor including lower electrodes each having the same thickness in the center portion and the edge portion, and upper electrodes which are connected to each other by using a corresponding connecting wire with low possibility of disconnection, (ii) a display device including the thin film capacitor, (iii) a memory cell including the thin film capacitor, and (iv) methods for manufacturing the thin film capacitor, the display device, and the memory cell.

In order to attain the object, a thin film capacitor of the present invention is a thin film capacitor including a plurality of regions each surrounded by a plurality of scanning signal lines and a plurality of data signal lines which perpendicularly intersect with each other on a substrate, the plurality of regions each including one of lower electrodes, a first insulating film, and one of upper electrodes which are provided in this order, wherein: each connecting wire electrically connects adjacent ones of the upper electrodes to each other, each connecting wire being positioned above the adjacent ones of the upper electrodes and intersecting with one of the data signal lines.

A method of the present invention for manufacturing a thin film capacitor is a method for manufacturing a thin film capacitor including a plurality of regions each surrounded by a plurality of scanning signal lines and a plurality of data signal lines which perpendicularly intersect with each other on a substrate, the plurality of regions each including: one of lower electrodes, a first insulating film, and one of upper electrodes which are provided in this order, the method including: electrically connecting adjacent ones of the upper electrodes to each other via a corresponding connecting wire which is positioned above the adjacent ones of the upper electrodes and intersects with one of the data signal lines.

According to this arrangement, each of the upper electrodes itself does not cover edge portions of adjacent lower electrodes, which edge portions are opposed to each other in a region where a corresponding data signal line is provided. Instead, the upper electrodes, which are adjacent to each other in the same manner as the adjacent lower electrodes in the region where the corresponding data signal line is provided, are connected to each other via the corresponding connecting wire being positioned above the upper electrodes and intersecting with one of the data signal lines. As a result, connecting wires, which connect the upper electrodes to the lower electrodes, are hardly disconnected, and in addition, each of the lower electrodes has the same thickness in the center portion and the edge portion because it is unnecessary for the lower electrodes to be shaped so that the edge portions thereof taper off as shown in Patent Literature 2. Further, in this arrangement, the connecting wires are provided so as to intersect with the data signal lines. That is, the upper electrodes adjacent to each other across the corresponding data signal line are connected to each other via corresponding one of the connecting wires each of which intersects with one of the data signal lines.

As a result, it is unnecessary for the thin film capacitor pars to have such a special planar shape so as to make connection between the upper electrodes adjacent to each other across the corresponding data signal line, and therefore it is possible to allow the thin film capacitor parts to have a simple planar shape. More specifically, in a case where each of the connecting wires does not intersect with one of the data signal lines, one of the upper electrodes adjacent to each other across the corresponding data signal line needs to be extended over (across) the corresponding data signal line up to the other one of the upper electrodes. As a result, each capacitor part has a complicated planar shape.

Since the planar shape of each of the thin film capacitor parts can be made simple, it is possible to form a thin film capacitor part, which is larger in area than that having a complicated planar shape, in each of the plurality of regions each surrounded by the scanning signal lines and the data signal lines. Accordingly, it is possible to achieve large capacitance.

A thin film capacitor of the present invention arranged as follows can also achieve the same effect as described above.

A thin film capacitor including laminated structures each of which is constituted by stacking one of lower electrodes, a first insulating layer, and one of upper electrodes, the laminated structures being provided along a second direction and on both sides of each of signal lines extending along a first direction, the second direction intersecting with the first direction, the upper electrodes being electrically connected to each other via a corresponding wire provided above the upper electrodes without making contact with edge portions of the laminated structures and the signal lines, the edge portions being opposed to each other along the second direction.

The first insulating film may be constituted by an insulating film having a multilayer structure of two or more layers.

It is preferable that the thin film capacitor of the present invention be a thin film capacitor further including first wires being provided above corresponding ones of the upper electrodes with a second insulating film therebetween, the second insulating film having first contact holes, the first wires being electrically connected to the respective corresponding ones of the upper electrodes through respective corresponding ones of the first contact holes, at least the first wires being used as the connecting wire.

It is preferable that the method of the present invention for manufacturing a thin film capacitor further include: providing first wires above corresponding ones of the upper electrodes with a second insulating film therebetween, the second insulating film having first contact holes; electrically connecting each of the first wires to the corresponding one of the upper electrodes through corresponding one of the first contact holes; and using at least the first wires as the connecting wire.

With this arrangement, it is possible to lead electrical connection from the upper electrodes to respective corresponding ones of the first wires positioned outside, through the respective corresponding ones of the first contact holes. This makes it possible to disperse electrical charge that has conventionally been concentrated locally between the upper electrodes and the lower electrodes. As a result, it is possible to prevent a breakdown of the thin film capacitor.

In other words, the arrangement of the present invention makes it possible to prevent a situation where electrical field is concentrated on regions in which the upper electrodes and the lower electrodes are close to each other and therefore insulation breakdown occurs (see (b) of FIG. 7).

In a case where each of the upper electrodes is electrically connected to a plurality of upper electrodes, the number of the first wires being provided above corresponding one of the upper electrodes may be equal to the number of the plurality of upper electrodes. With this arrangement, the upper electrode and the plurality of upper electrodes provided on both sides of the upper electrode can be connected to each other via first wires corresponding to the respective plurality of upper electrodes.

The thin film capacitor of the present invention is preferably arranged such that each of the upper electrodes, which face the lower electrodes corresponding thereto, has a planar outline being inside a planar outline of corresponding one of the lower electrodes.

It is preferable that the method of the present invention for manufacturing the thin film capacitor further include arranging the upper electrodes, which face respective lower electrodes, such that a planar outline of each of the upper electrodes is inside a planar outline of corresponding one of the respective lower electrodes.

With the arrangement, each of the upper electrodes, which face lower electrodes corresponding thereto, has a planar outline being inside a planar outline of the lower electrode corresponding thereto. That is, each of the upper electrodes exists independently in a shape of island. This makes it possible to decrease electrical charge between the upper electrodes and the lower electrodes provided in respective islands, and to prevent a breakdown of the thin film capacitor.

Further, in the arrangement in which each of the upper electrodes has a planar outline being inside a planar outline of the lower electrode corresponding thereto, there is no region where the upper electrodes and the lower electrodes are close to each other (see (b) of FIG. 7). As a result, electrical filed is not concentrated on one particular region. This also contributes to prevention of the insulation breakdown.

It is preferable that the thin film capacitor of the present invention be a thin film capacitor further including a second wire provided above the first wires with a third insulating film therebetween, the third insulating film having second contact holes, the second wire running over one of the data signal lines, each of the first wires being electrically connected to the second wire through corresponding one of the second contact holes, at least the first wires and the second wire being used as the connecting wire.

It is preferable that the method of the present invention for manufacturing the thin film capacitor further include: providing a second wire above the first wires with a third insulating film therebetween, the third insulating film having second contact holes, the second wire running over one of the data signal lines, electrically connecting each of the first wires to the second wire through corresponding one of the second contact holes, and using at least the first wires and the second wire as the connecting wire.

With the arrangement, it is possible to lead electrical connection to the second wire provided in an upper position through the corresponding one of the second contact holes. As a result, it is possible to further disperse the electrical charge between the upper electrodes and the lower electrodes.

The thin film capacitor of the present invention is preferably arranged such that each of the first contact holes and the corresponding one of the second contact holes are not aligned coaxially to each other.

The method of the present invention for manufacturing the thin film capacitor is preferably arranged such that the first contact holes and corresponding ones of the second contact holes are provided in such a manner that each of the first contact holes and corresponding one of the second contact holes are not aligned coaxially to each other.

If each of the first contact holes and the corresponding one of the second contact holes are aligned coaxially to each other, when an interlayer film is formed on the first contact holes below which the lower electrodes are provided, the interlayer film is formed in recessed parts of the first contact holes. The interlayer film formed in the first contact holes adds to a thickness of the interlayer film. As a result, a part of the interlayer film is left, as a residue, inside the recessed parts of the first contact holes on the lower electrodes, thereby causing a contact defect. In this regard, since the above-described present invention is arranged such that each of the first contact holes and the corresponding one of the second contact holes are not aligned coaxially to each other, it is possible to solve the problem of the contact defect.

The thin film capacitor of the present invention is preferably arranged such that each of the first wires is provided below corresponding one of the data signal lines, and is used solely as one of the connecting wires.

The method of the present invention for manufacturing the thin film capacitor is preferably arranged such that each of the first wires is provided below corresponding one of the data signal lines, and is used solely as the connecting wire.

With the arrangement, the upper electrodes are connected to each other solely via corresponding one of the first wires. As a result, it is possible to further downsize connection.

A display device of the present invention preferably includes any one of the thin film capacitors as set forth above.

A method of the present invention for manufacturing a display device preferably includes any one of the methods as set forth above for manufacturing a thin film capacitor.

A memory cell of the present invention preferably includes, as a data storage capacitor, any one of the thin film capacitors as set forth above.

A method of the present invention for manufacturing a memory cell preferably includes, as a method for manufacturing a data storage capacitor, any one of the methods as set forth above for manufacturing a thin film capacitor.

Limitations as set forth above regarding a liquid crystal display device may be combined arbitrarily. Such a combination also attain an object of the present invention.

For a fuller understanding of the nature and advantages of the invention, reference should be made to the ensuing detailed description taken in conjunction with the accompanying drawings.

BRIEF DESCRIPTION OF DRAWINGS

FIG. 4, showing a structure of the pixel auxiliary capacitor parts of the liquid crystal panel substrate of FIG. 3, is a cross-sectional view taken along the dashed line of FIG. 3.

FIG. 6, showing a structure of the pixel auxiliary capacitor parts of the liquid crystal panel substrate of FIG. 5, is a cross-sectional view taken along line A-A.

EXPLANATION OF REFERENTIAL NUMERALS

1 Glass Substrate (Substrate)
3 Lower Electrode
4 Gate Insulating Film (First Insulating Film)
5 Upper Electrode
6 First Interlayer Insulating Film (Second Insulating Film)
7 First Contact Hole
8 First Wire (Connecting Wire)
10 Pixel Auxiliary Capacitor Part
11 Data Signal Line
12 Gate Metal Wire (Scanning Signal Line)
15 Second Contact Hole
17 Second Interlayer Insulating Film (Third Insulating Film)
20 Second Wire (Connecting Wire)
31 Data Signal Line

DESCRIPTION OF EMBODIMENTS

[Schematic Structure of Capacitor Part and Peripheral Circuit Thereof]

One embodiment of the present invention is described below with reference to the attached drawings.

Figure 1:
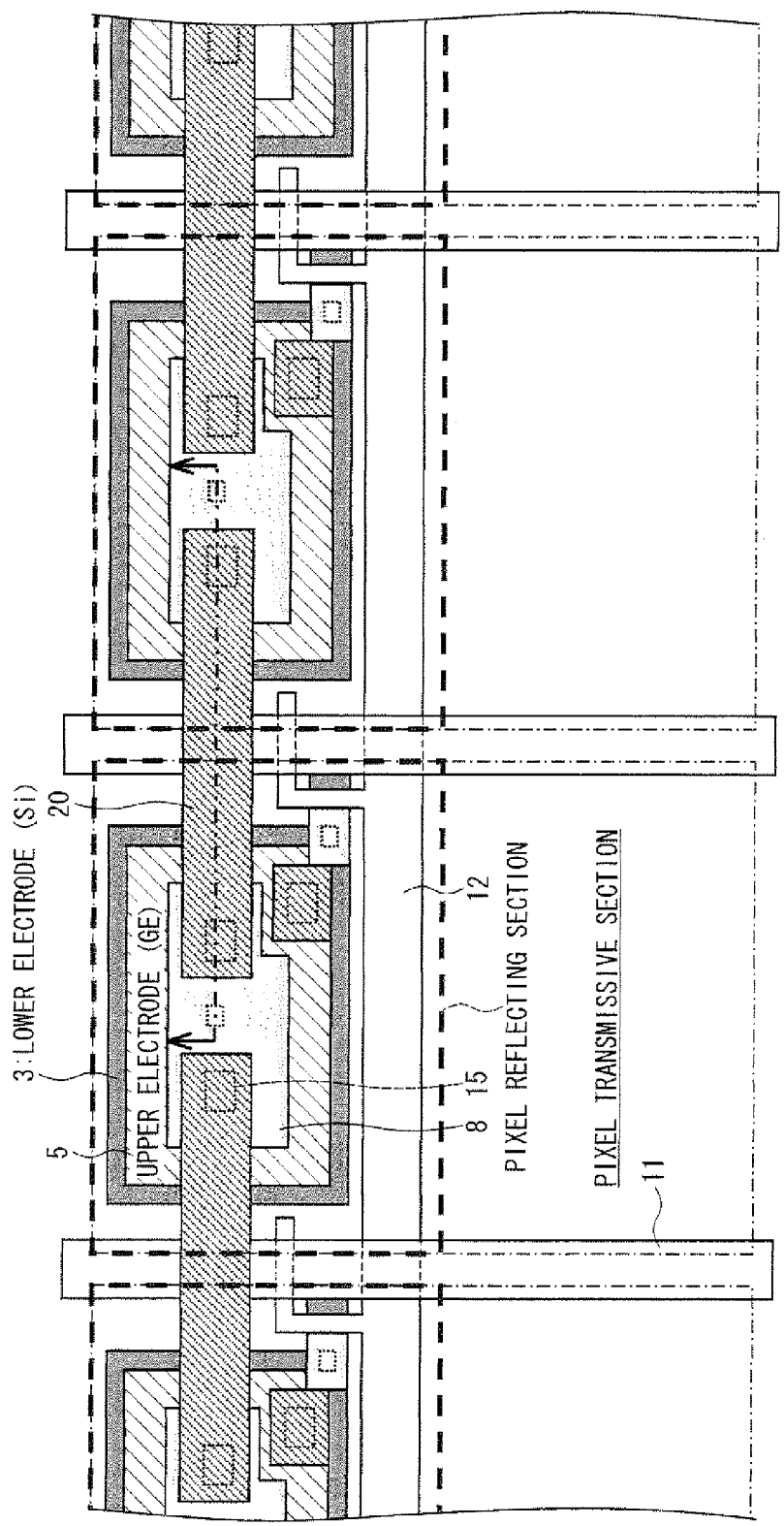
FIG. 1, showing an embodiment of a liquid crystal display device of the present invention, is a plan view illustrating pixel auxiliary capacitor parts and a peripheral circuit including TFTs on a liquid crystal panel substrate.

FIG. 1 is a plan view illustrating a peripheral circuit layout including capacitor parts (pixel auxiliary capacitor parts; "thin film capacitor parts" of Claims) on a liquid crystal panel substrate. (a) of FIG. 2 is a cross-sectional view taken along the dashed line of FIG. 1.

As illustrated in FIG. 1, on the liquid crystal panel substrate, data signal lines 11; gate metal wires (scanning signal lines) 12 which perpendicularly intersect with the data signal lines 11; a plurality of second wires 20 which are parallel with the scanning signal lines 12 and are provided for respective data signal lines 11 so as to run over the respective data signal lines 11; and capacitor parts 10 are provided. Note in FIG. 1 that the capacitor parts 10 are marked with dashed squares for convenience.

The data signal lines 11 and the scanning signal lines 12 are arranged so as to define each region, which is a pixel region. The pixel region is structured such that a reflecting region (a pixel reflecting section) is provided above the corresponding scanning signal lines 12 and a pixel auxiliary capacitor part, and a transmissive region (a pixel transmissive section) is provided in a region through which light passes from behind.

Figure 2:
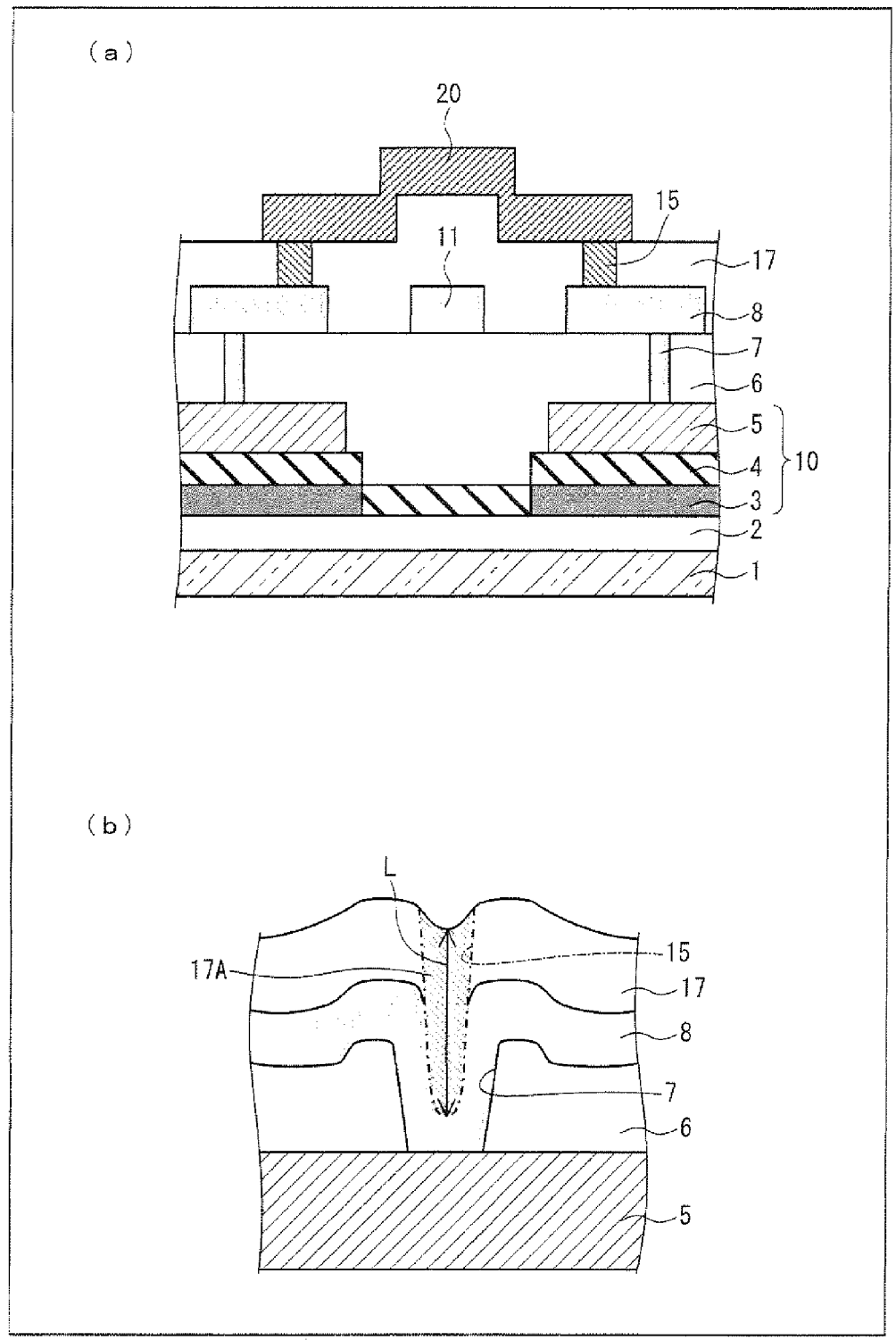
FIG. 2 shows cross-sectional views illustrating a structure of the pixel auxiliary capacitor parts of the liquid crystal panel substrate of FIG. 1. (a) of FIG. 2 is a cross-sectional view taken along the dashed line of FIG. 1. (b) of FIG. 2 illustrates a laminated structure of a first contact hole and surrounding portion thereof, on which a second contact hole is not yet formed.

As illustrated in (a) of FIG. 2, each of the capacitor parts 10 includes a lower electrode (a first electrode; Si; silicon) 3; a gate insulating film (GI: Gate Insulator; "a first insulating film" of claims 4; and an upper electrode (a second electrode; GE; gate metal) 5. Further, below the lower electrode 3, an undercoating 2 and a glass substrate 1 are provided in this order from the lower electrode 3 (see (a) of FIG. 2).

Moreover, above the upper electrode 5, a first interlayer insulating film ("a second insulating film" of claims 6; a first wire 8; a second interlayer insulating film ("a third insulating film" of claims 17; and a second wire 20 are provided in this order from the upper electrode 5 (see (a) of FIG. 2). Here, the first wire 8 is provided in the same layer as the data signal lines 11, in such a manner that adjacent first wires 8 are on both sides of a corresponding data signal line 11 (see (a) of FIG. 2).

The present embodiment is characterized especially by how upper electrodes 5 of adjacent ones of the capacitor parts 10 are electrically connected with each other.

As illustrated in (a) of FIG. 2, the upper electrodes 5 provided in the adjacent ones of the capacitor parts 10 are connected to each other via the first wire 8 and the second wire 20. In the present embodiment, the first wire 8 and the second wire 20 constitute "a connecting wire" of Claims.

More specifically, as illustrated in (a) of FIG. 2, each of the upper electrodes 5 is connected to the first wire 8 through a first contact hole 7 of the first interlayer insulating film 6 provided on the upper electrodes 5, and then the first wire 8 is connected to the second wire 20 through a second contact hole 15 of the second interlayer insulating film 17 provided on the first wire 8.

Further, the first contact hole 7 and the second contact hole 15 are preferably arranged such that the first contact hole 7 and the second contact hole 15 are not aligned coaxially to each other. The reason therefor is described with reference to (b) of FIG. 2. (b) of FIG. 2 is a cross-sectional view providing magnified illustration showing more details of a laminated structure including the upper electrode 5 at a bottom and the second interlayer insulating film 17 at a top. The cross-sectional view illustrates the laminated structure at a time when the second interlayer insulating film 17 is formed on the first contact hole 7.

As illustrated in (b) of FIG. 2, there is a recessed part in the first contact hole 7 on which the first wire 8 is stacked. For this reason, when an interlayer insulating film (the second interlayer insulating film 17) above the first contact hole 7 is formed on the first contact hole 7, the interlayer insulating film is formed in the recessed part. The interlayer insulating film formed in the recessed part adds to a thickness L of the second interlayer insulating film 17.

If the first contact hole 7 and the second contact hole 15 are aligned coaxially to each other, the second interlayer film 17 filling a part 17A (a part marked with a dashed line in (b) of FIG. 2) needs to be completely removed so as to form the second contact hole 15. However, since the thickness L of the second interlayer insulating layer 17 filling the part 17A is large, it is difficult to completely remove the second interlayer insulating film 17 from the part 17A. As a result, a part of the second interlayer insulating film 17 is left as a residue in the recessed part of the first contact hole 7 when the second contact hole 15 is formed, thereby causing a contact defect. The contact defect can be prevented by arranging the first contact hole 7 and the second contact hole 15 so that the first contact hole 7 and the second contact hole 15 are not aligned coaxially to each other.

The first wire 8 is formed generally by a sputtering method, as described later. In such a case, the first wire 8 having a same or smaller thickness is formed on an inner surface of the first contact hole 7 and around the first contact hole 7. This makes it more likely that the recessed part is formed on the first contact hole 7.

Conventionally, upper electrodes 5 which are connected all together retained electrical charge caused by a dry etching, which is performed to pattern the upper electrodes 5. The present embodiment makes it possible to disperse the electrical charge over the upper electrodes 5 and to retain the electrical charge thus dispersed in each of the upper electrodes 5. In addition, since the electrical charge retained in each of the upper electrodes 5 is discharged once during this process, the upper electrodes 5 are to have a maximum amount of the electrical charge that is smaller than a maximum amount of the electrical charge retained in the conventional upper electrodes connected all together, when the upper electrodes 5 are connected with one another. As a result, it is possible to prevent the upper electrodes from being damaged by electrostatic discharge during a manufacturing process.

Moreover, the present invention has an advantageous effect over the unpublished (as of the priority date of the subject application) invention filed by the present inventors prior to the subject application. The unpublished invention is later explained as [Reference Example]. According to the reference example, each capacitor part has a complicated shape. This is because capacitor parts are connected to one another not with wires, i.e., the wires intersecting with respective signal lines like the present embodiment, but with another wires. This made it necessary to make the shape of each of the capacitor parts complicated so as to make connection.

In contrast, the present embodiment is arranged such that the upper electrodes 5 are electrically connected to each other with a corresponding connecting wire (the first wire 8 and the second wire 20), which intersects with a corresponding data signal line 11 and is provided above the corresponding upper electrode. Since this makes it unnecessary for the capacitor parts to have such a special planar shape so as to connect the upper electrodes to each other, it is possible to allow the capacitor parts to have a simple planar shape. As a result, it is possible for the capacitor parts to occupy large area, and it is possible to prevent a low yield caused by a short circuit between electrodes. Further, since it is unnecessary to arrange the lower electrodes so that edge portions thereof taper off (refer to Patent Literature 2), it is possible to achieve lower electrodes each having the same thickness in the center portion and the edge portion.

The structure of each of the capacitor parts 10 can be described also as follows. That is, each of the capacitor parts 10 includes: laminated structures each of which is constituted by stacking a lower electrode 3, a first interlayer insulating film 6, and an upper electrode 5, the laminated structures being provided along a second direction and on both sides of each of data signal lines 11 extending along a first direction, the second direction intersecting with the first direction, the upper electrodes 5 being electrically connected to each other via a corresponding first wire 8 and a corresponding second wire 20 provided above the upper electrodes 5 without making contact with edge portions of the laminated structures and the signal lines, the edge portions being opposed to each other along the second direction.

The first wires 8 are provided in the same layer as the data signal lines 11, and the second wires 20 are provided above a layer in which the data signal lines 11 are provided.

Next, a method for manufacturing the capacitor parts and the peripheral circuit illustrated in FIGS. 1 and 2 is described.

[Method for Manufacturing Capacitor Parts and Peripheral Circuit]

First, a glass substrate 1, serving as a base material on which capacitor parts 10 are to be formed, is pretreated, i.e., washed and pre-annealed.

(1) Process of Forming Lower Electrode 3

On the glass substrate 1, an undercoating (TEOS/SiNO; 100 nm/50 nm) 2; and an amorphous silicon (a-Si) layer for lower electrodes (Si) 3 are formed by a plasma enhanced chemical vapor deposition (PECVD). Next, a solid-phase crystallization (SPC), which causes crystallization by thermal treatment at approximately 600° C., is performed. Examples of other materials that can be used for the undercoating 2 are SiNx, SiON, and $SiH_4+N_2O$.

Prior to the solid-phase crystallization (SPC), a metal catalyst may be applied on the amorphous silicon (a-Si) layer as pre-treatment for CG-siliconization.

Meanwhile, the solid-phase crystallization (SPC) alone is not enough and will result in crystal grains having small sizes or in crystal grains having large sizes but with a lot of crystal imperfections inside thereof. This causes poor characteristics, such as a low mobility, in pixel TFTs.

Hence, next, an excimer laser annealing is performed to improve qualities of the crystal grains.

Lastly, patterning is performed by a photolithographic method, and then patterns are etched so as to achieve a desired shape of a silicon (Si) layer. As such, the lower electrodes 3 having a thickness of 50 nm are formed.

(2) Process of Forming Gate Insulating Film 4

Next, a gate insulating film 4 having a thickness of 45 nm is formed from tetraethyl orthosilicate (TEOS) gas as raw gas by a CVD method. Examples of other raw materials of the gate insulating film 4 are SiNx or SiON, and $SiH_4+N_2O$.

(3) Channel Doping Process

Then, in order to adjust threshold values of a pixel transistor and of other transistors required for driving circuits of a liquid crystal panel, (i) boron is doped all over a substrate, (ii) a part to which boron is to be doped is patterned by the photolithographic method and then a predetermined amount of boron is channel-doped to the part thus patterned; or (iii) both of the above-described procedures (i) and (ii) are performed.

Further, in a case where an overlapped structure is required due to the transistors, the photolithographic method is performed to achieve a desired pattern and then a predetermined amount of phosphorus is doped. This channel doping process may also be performed prior to formation of the gate insulating film 4.

Due to this doping treatment, the lower electrodes 3 made of the silicon (Si) layer and provided in the capacitor parts become conductive to attain the function of electrodes.

(4) Process of Forming Upper Electrode 5

Next, a tungsten (W) film/a tantalum nitride (TaN) film (W/TaN; 370 nm/30 nm) is formed by sputtering or the like. Examples of other metals usable for upper electrodes 5 are low-resistive metals such, as MoW and Al, and smooth-faced high-melting-point metals having stable characteristics.

Then, the photolithographic method is performed to achieve a desired pattern, and thereafter, a dry etching is performed with mixed gas with a predetermined ratio of gases such as Ar, $SF_6$, $CF_4$, $O_2$, and/or $Cl_2$. As such the upper electrodes 5 each having a double layer structure are formed.

(5) Process of Forming First Interlayer Insulating Film 6

Next, a first interlayer insulating film 6 having a double layer structure is formed by PECVD. The first interlayer insulating film 6 can be made from such materials as SiNx, SiON, and TEOS. For example, a lower layer can be made from SiN having a thickness of 250 nm, and an upper layer can be made from TEOS having a thickness of 700 nm.

(6) Process of Forming First Contact Hole 7

Next, a desired photolithographic method is performed, and thereafter, the dry etching is performed to form contact holes 7.

(7) Annealing Treatment Process

Further, a hydrogenation annealing treatment is performed at approximately 400° C. so as to improve quality of silicon (Si).

(8) Process of Forming Data Signal Lines 11 and First Wire 8

Next, the sputtering method is performed to form a thin metal film constituted by stacking a titanium (Ti) film, an aluminum-silicon (Al—Si)-type alloy film, and a Ti film in this order. The titanium (Ti) film, the aluminum-silicon (Al—Si)-type alloy film, and the Ti film may have thicknesses of, for example, 100 nm, 400 nm, and 100 nm, respectively. The Al—Si-type alloy metal film may be substituted by an Al film. Further, since the Ti film in an upper layer is easily oxidizable, the Ti film may be substituted by TiN or the like, which is hardly oxidizable. Furthermore, an oxidized film on a surface may be removed, prior to formation of a second wire 20, by an etchant such as HF or BHF, or by an Ar plasma treatment.

Next, the photolithographic method is performed to achieve a desired pattern, and thereafter, the dry etching is performed to form the data signal lines 11 and the first wire 8. Here, the data signal lines 11 are provided respectively between the capacitor parts 10 adjacent with each other, and, first wires 8 are provided respectively on both sides of a corresponding data signal line 11 in such a manner that the first wires 8 are detached from the corresponding first wire 11 and face corresponding upper electrodes 5, respectively.

In this way, the upper electrodes 5 and the first wires 8 are connected to each other through corresponding contact holes 7.

(9) Process of Forming Second Interlayer Insulating Film 17

Next, a second interlayer insulating film 17 is formed by a spin method. The second interlayer insulating film 17 may be made from JAS (a photosensitive acrylic material) or the like. Since the JAS has excellent flatness and photosensitivity, it is possible to level out irregularity of a layer therebelow, as well as to make it possible to form contact holes by performing a light irradiation process and a developing process without performing the etching process. As a result, it is possible to achieve a shortened process. The second interlayer insulating film 17 may have a thickness of, for example, 3 μm.

(10) Process of Forming Second Contact Hole 15

Next, second contact holes 15 are formed by performing the light irradiation process and the developing process. Each of the second contact holes 15 is formed so that an undermost portion of an opening thereof is opened above a corresponding second metal wire 8.

(11) Process of Forming Second Wire 20

Next, a thin metal film constituted by stacking an Al (aluminum) film and an Mo (molybdenum) film in this order is formed by the sputtering method. The Al film and the Mo film may have thicknesses of, for example, 400 nm and 50 nm, respectively.

Then, the lithographic method is performed so as to achieve a desired pattern, and thereafter, the dry etching is performed so as to form second wires 20. Each of the second wires 20 is provided so as to connect adjacent ones of the first wires 8 which are electrically connected to upper electrodes 5 of the adjacent ones of the capacitor parts 10, as well as to run over the corresponding data signal line 11.

As described above, in the capacitor parts of the liquid crystal panel substrate of the present embodiment and the method for manufacturing the capacitor parts, each of the upper electrodes 5 facing respective lower electrodes 3 does not bridge between the lower electrodes 3. Thus, the upper electrodes 5 are not affected by edges.

As a result, it is possible to provide a thin film capacitor not affected by edge portions of lower electrodes 3 and a method for manufacturing the thin film capacitor as such.

Further, since it is unnecessary to arrange the lower electrodes 3 so that the edge portions thereof taper off as in Patent Literature 2, it is possible to give a same thickness to a center portion and the edge portion of each of the lower electrodes 3.

Furthermore, to say repeatedly, this arrangement makes it possible to achieve a simple planar shape of each of the capacitor parts, and allows the capacitor parts to occupy larger areas than the later-described [Reference Example]. As a result, it becomes possible to prevent a low yield caused by a short circuit between electrodes.

The reason why the planar shape can be made simpler than the later-described [Reference Example] is described in more details below. In [Reference Example], a connecting wire connecting adjacent upper electrodes to each other does not intersect with a corresponding data signal line. Therefore, one of the upper electrodes needs to be extended toward the other one of the upper electrodes so that the upper electrodes (capacitor parts) provided on both sides of the corresponding data signal line are connected to each other (see FIG. 5). Thus, the planar shape of each of the capacitor parts needs to be a special shape. In contrast, according to the present embodiment, since each connecting electrode intersects with the corresponding data signal line, it is unnecessary to arrange each of the capacitor parts so as to have the special planar shape to make connection.

[Modification of the Present Embodiment]

The present embodiment is not limited to the above-described structures, and may be structured as follows.

Figure 3:
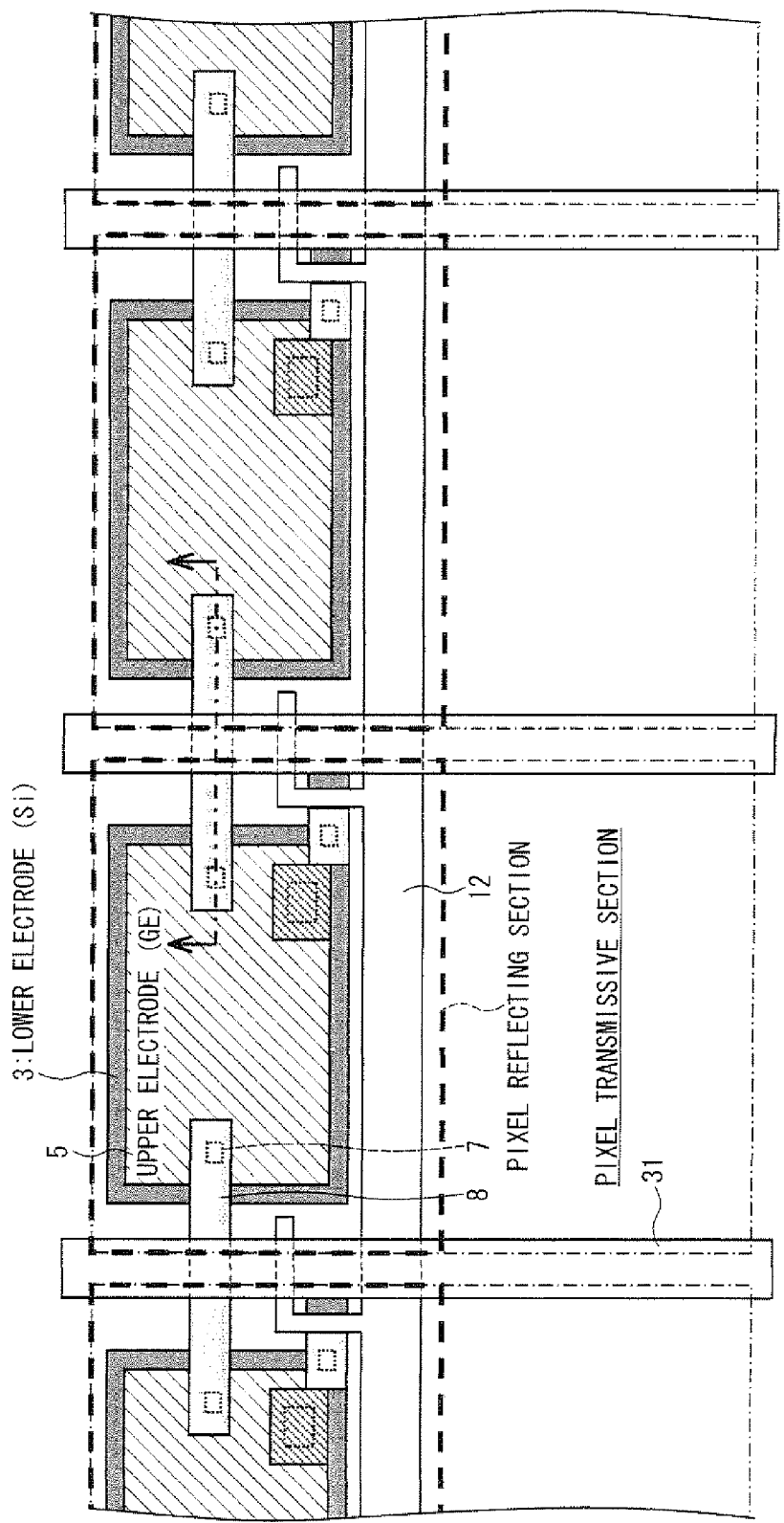
FIG. 3, showing a modification of an embodiment of the present invention, is a plan view corresponding to FIG. 1.

That is, peripheral circuit layout including the capacitor parts 10 on the liquid crystal panel substrate is not limited to the one illustrated in FIGS. 1 and 2, and may be the one illustrated in FIGS. 3 and 4. FIG. 3 is a plan view illustrating a modification of FIG. 1. FIG. 4, which is a cross-sectional view taken along the dashed line of FIG. 3, is a cross-sectional view illustrating a modification of FIG. 2.

According to a peripheral circuit layout illustrated in FIG. 3, data signal lines 31 provided directly on a second interlayer insulating film 17 are provided, as source lines (signal wires), so as to perpendicularly intersect with scanning signal lines 12. In addition, first wires 8, each of which solely connects adjacent upper electrodes 5 of the capacitor parts 10, are provided below a corresponding data signal line 31.

In other words, the peripheral circuit layout illustrated in FIG. 3 is designed such that the adjacent upper electrodes 5 are connected to each other with a corresponding first wire 8 alone, and there is no contact hole on the second interlayer insulating film 17. Therefore, the first wire 8, which was provided between adjacent ones of the capacitor parts 10 in such a manner that the first wire 8 is detached from the capacitor parts 10 in FIGS. 1 and 2, is provided so as to electrically connect the adjacent ones of the capacitor parts 10 in FIGS. 3 and 4.

Further, according to the structure illustrated in FIGS. 1 and 2, the data signal lines 11 provided on the first interlayer insulating film 6 served as signal wires. In contrast, according to the structure illustrated in FIGS. 3 and 4, the data signal lines 31 provided on the second interlayer insulating film 17 that is provided in a layer positioned above the first interlayer insulating film 6 serve as the signal lines.

The modification is also structured such that adjacent upper electrodes 5 are connected to each other with a connecting wire (In the modification, the connecting wire consists of the first wire 8 only), which intersects with a corresponding data signal line 31 and is provided above an upper electrode 5. Therefore, the modification achieves at least the same working effect as the above-described embodiment.

The structure of each of the capacitor parts 10 can be described also as follows. That is, each of the capacitor parts includes: laminated structures each of which is constituted by stacking a lower electrode 3, a first interlayer insulating film 6, and an upper electrode 5, the laminated structures being provided along a second direction and on both sides of each of data signal lines 31 extending along a first direction, the second direction intersecting with the first direction, the upper electrodes 5 being electrically connected to each other via a corresponding first wire 8 provided above the upper electrodes 5 without making contact with edge portions of the laminated structures and the signal lines 31, the edge portions being opposed to each other along the second direction.

The first wires 8 are provided between a layer in which the data signal lines 31 are provided and a layer in which the upper electrodes 5 are provided.

Next, a method for manufacturing the structure of the modification illustrated in FIGS. 3 and 4 is described only in terms of a part different from the method for manufacturing the structure illustrated in FIGS. 1 and 2. Descriptions of the same parts are omitted here.

The method for manufacturing the structure of the modification is the same as that of the structure of FIGS. 1 and 2 until the annealing treatment described in the process (7).

In the process (8), the first wire 8 is provided, with the same material and the same method, so that the adjacent ones of the capacitor parts 10 are connected to each other with the first wire 8 alone.

Then, the second interlayer insulating film 17 is formed through the same manner as in the process (9), and thereafter, without forming the second contact hole explained in the process (10), the data signal lines 31 are formed with the same manner and the same materials as in the process (11). Note in the process (11) that each of the data signal lines 31 is provided between the adjacent ones of capacitor parts 10 so as not to be electrically connected to wires positioned below a layer in which the data signal lines 31 are provided, unlike the method of FIGS. 1 and 2.

The structure of the modification is more excellent than that of the above-described embodiment in terms of the following points.

Since the first interlayer insulating film 6 is made of an inorganic film, it can be dry-etched. As a result, it is possible to microfabricate the first interlayer insulating film 6, so that microscopic contact holes and microscopic wires can be formed.

In contrast, the second interlayer insulating film 17 provided above the first interlayer insulating film 6 is generally made of a photosensitive organic film. In this case and other cases, etching is generally performed by wet etching. Therefore, a layer in an upper position requires a larger margin when performing processing operations, i.e., a layer in an upper position is more difficult to be accurately processed. According to the structure of the modification, the second interlayer insulating film 17 does not have a contact hole, and the adjacent ones of the upper electrodes 5 are electrically connected to each other below a layer in which the second interlayer insulating film 17 is formed. Since the contact hole is not provided on the second interlayer insulating film 17, contact sections to be provided on the upper electrodes 5 have a small area occupation ratio. As a result, it is possible to form a small pixel auxiliary capacitor part. Further, according to the structure of the modification, it is possible to downsize connection.

Further, since it is unnecessary to provide the first wire 8, which is an intermediary wire connecting the first contact hole 7 with the second contact hole 15, it is possible to reduce the size of the pixel auxiliary capacitor part. In addition, since outlines and space of the data signal lines 31 are not so much concentrated, it is possible to have large margins to perform processing operations.

In the present embodiment and the modification, only a case where the capacitor parts are mounted on a liquid crystal panel substrate of a liquid crystal display device was described. However, the present invention is not limited to this case, and a structure of the present invention, which structure includes a lower electrode 3, an insulating film 4 and an upper electrode (GE) 5, is applicable to a data storage capacitor of a memory cell. For example, the structure of the present invention is applicable to a memory cell such as an image frame memory constituted by integrating DRAMs on a glass substrate.

As described above, it is possible to provide (i) a memory cell that is not affected by edge portions of lower electrodes 3 and (ii) a method for manufacturing the memory cell, by utilizing the above-described thin film capacitor as a data storage capacitor in the memory cell and in the method for manufacturing the memory cell.

Further, it is also possible to describe that the thin film capacitor of the present invention includes an interlayer insulating film and upper layer metal wires provided in a layer positioned above source metal wires, and electrically connects upper electrodes (GE) of pixel auxiliary capacitor parts to each other through a corresponding source metal wire and a corresponding upper layer metal wire.

Furthermore, it is also possible to describe that the thin film capacitor of the present invention includes an interlayer insulating film and upper layer metal wires provided in a layer positioned above source metal wires, and electrically connects upper electrodes (GE) of pixel auxiliary capacitor parts to each other through a corresponding source metal wire.

The structure of the present invention is detectable by, for example, an optical microscope or a cross-sectional SEM.

[Reference Example of Present Embodiment]

According to the present embodiment, upper wires of the adjacent ones of the capacitor parts are connected to each other above or below a corresponding signal wire.

Figure 5:
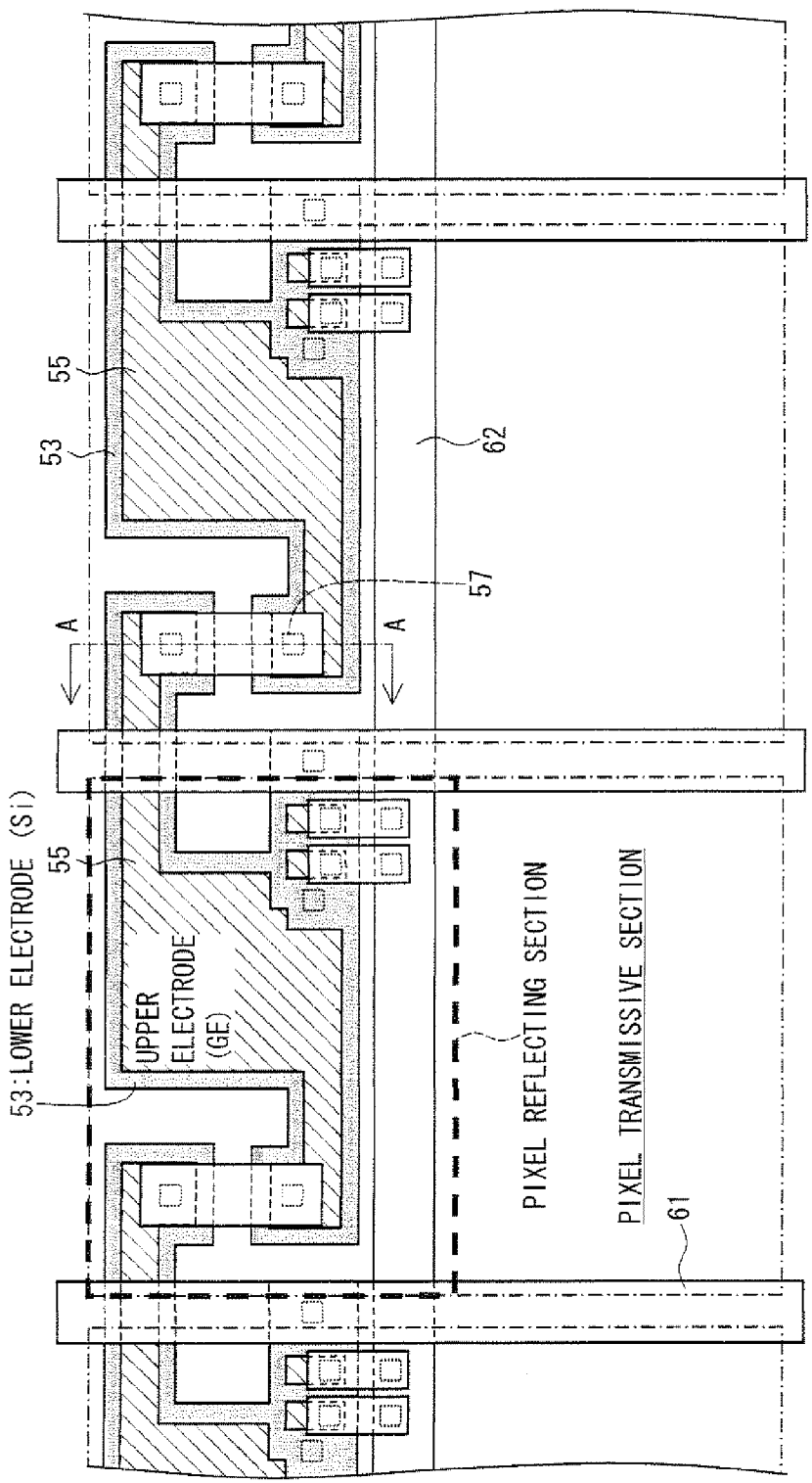
FIG. 5, showing a reference example of the present invention, is a plan view corresponding to FIG. 1.
Figure 7:
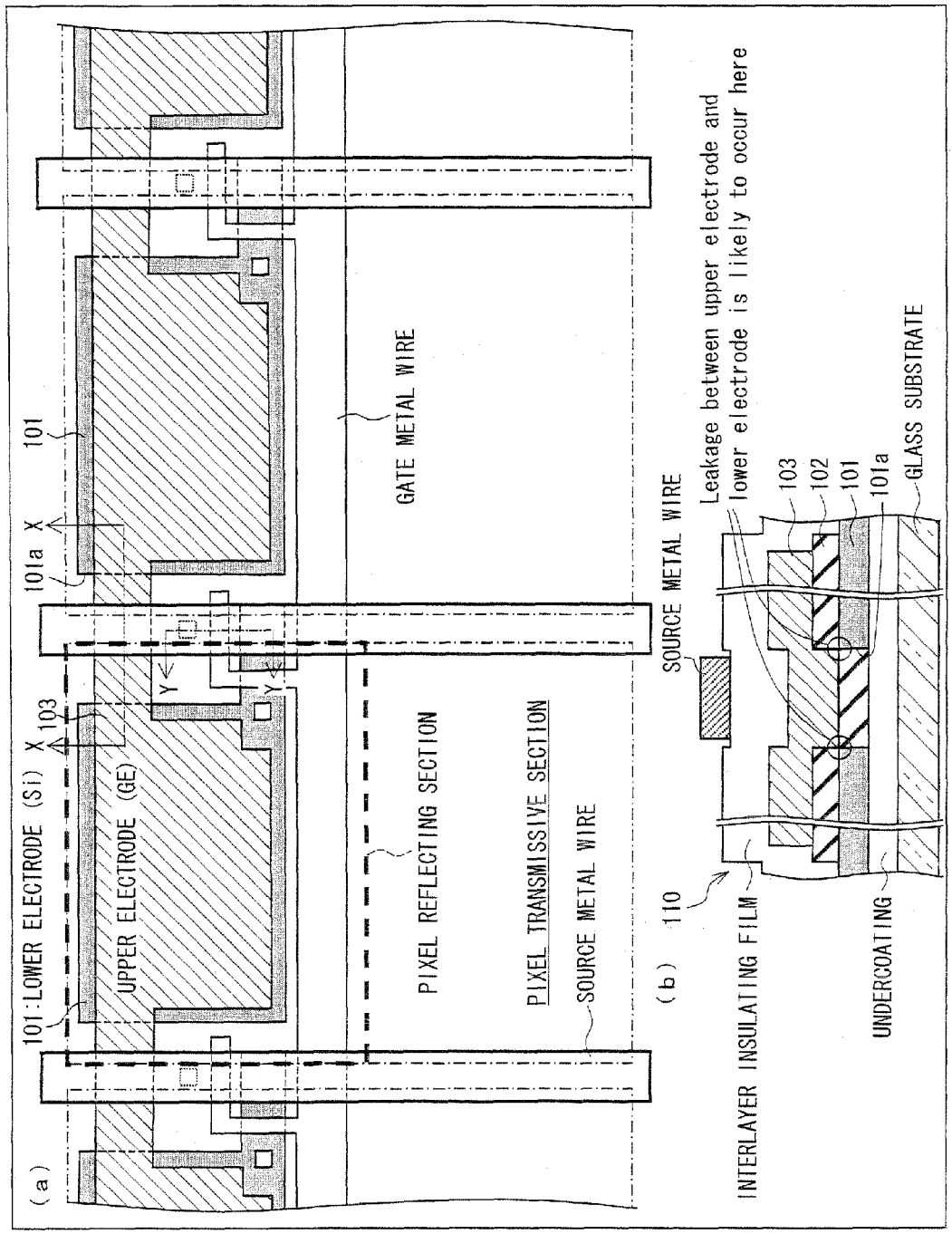
FIG. 7 shows a conventional liquid crystal display device. (a) of FIG. 7 is a plan view illustrating pixel auxiliary capacitor parts and a peripheral circuit including TFTs on a liquid crystal panel substrate. (b) of FIG. 7, showing a structure of the pixel auxiliary capacitor parts of the liquid crystal panel substrate, is a cross-sectional view taken along line X-X of (a) of FIG. 7.
Figure 8:
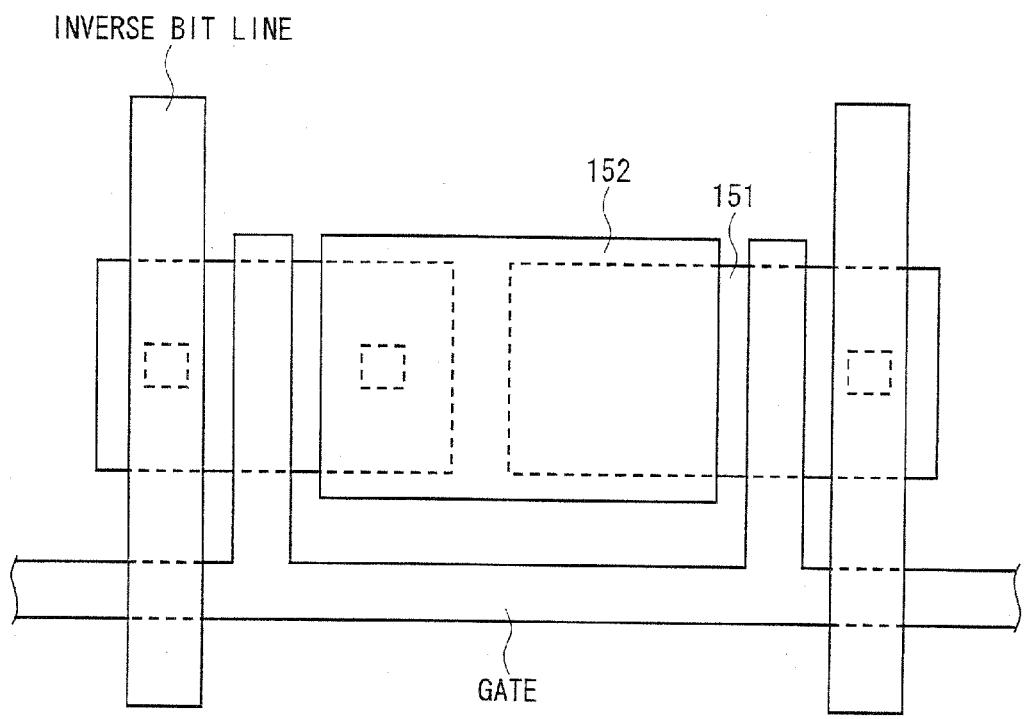
FIG. 8 is a plan view illustrating a configuration of a conventional memory cell.
Figure 9:
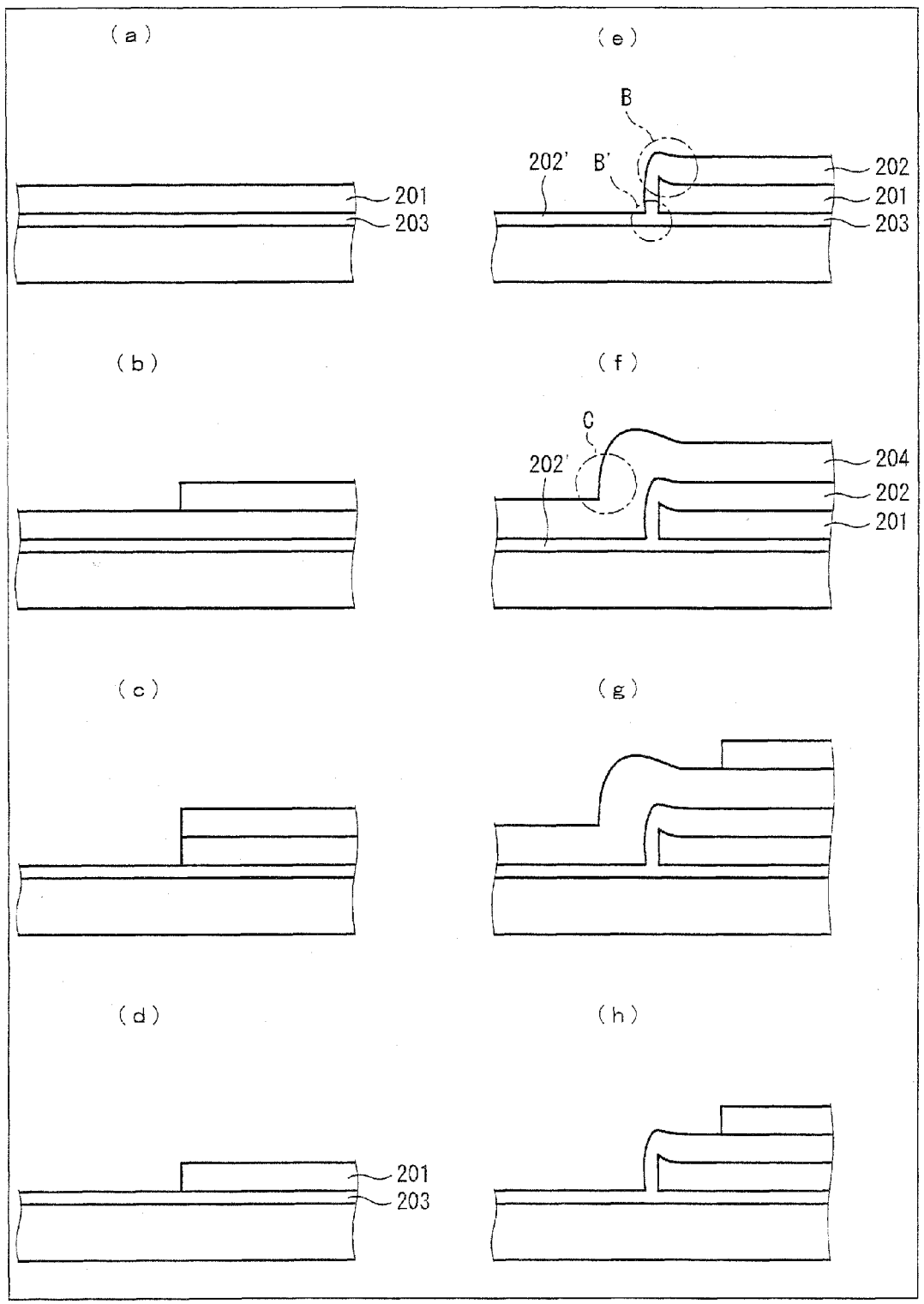
FIG. 9 shows cross-sectional views illustrating a manufacturing process of a conventional semiconductor device.
Figure 10:
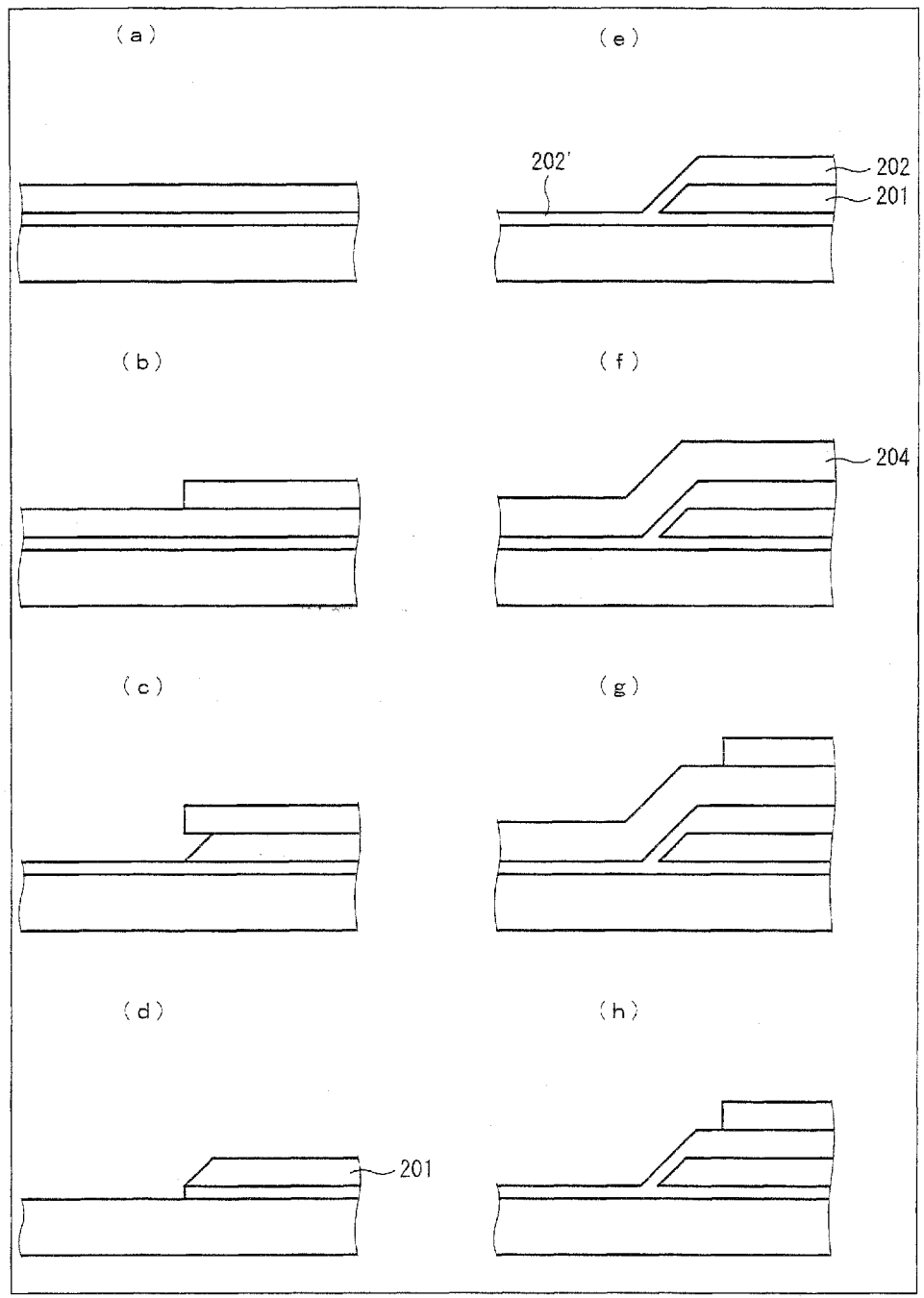
FIG. 10 shows cross-sectional views illustrating a manufacturing process of another conventional semiconductor device.

On the other hand, according to the unpublished invention already filed by the present inventors prior to the subject application (Reference Example), as illustrated in FIGS. 5 and 6, upper wires 55 of adjacent capacitor parts 60 are connected to each other in a place other than that in which data signal lines are provided. To achieve such connections, Reference Example is arranged such that a planar shape of each of the capacitor parts 60 is in a substantially S shape in which both sides of an S shape extends outwards (see FIG. 5), not in a rectangular shape like the present embodiment. As a result, each of the capacitor parts 60 is in a complicated shape, as well as a short circuit is likely to occur between the upper electrodes 55.

In contrast, according to the present embodiment of the present invention, a planar shape of each pixel auxiliary capacitor part (capacitor part) is in a simple shape. As a result, it is possible to achieve capacitor parts occupying large areas, as well as to prevent a low yield caused by the short circuit between electrodes.

As so far described, a thin film capacitor of the present invention is a thin film capacitor including a plurality of regions each surrounded by a plurality of scanning signal lines and a plurality of data signal lines which perpendicularly intersect with each other on a substrate, the plurality of regions each including one of lower electrodes, a first insulating film, and one of upper electrodes which are provided in this order, wherein: each connecting wire electrically connects adjacent ones of the upper electrodes to each other, each connecting wire being positioned above the adjacent ones of the upper electrodes and intersecting with one of the data signal lines.

As so far described, a method of the present invention for manufacturing a thin film capacitor is a method for manufacturing a thin film capacitor including a plurality of regions each surrounded by a plurality of scanning signal lines and a plurality of data signal lines which perpendicularly intersect with each other on a substrate, the plurality of regions each including: one of lower electrodes, a first insulating film, and one of upper electrodes which are provided in this order, the method comprising: electrically connecting adjacent ones of the upper electrodes to each other via a corresponding connecting wire which is positioned above the adjacent ones of the upper electrodes and intersects with one of the data signal lines.

As a result, it is possible to provide (i) a thin film capacitor in which each lower electrode has a same thickness in a center portion and an edge portion, and upper electrodes are connected to each other by using a connecting wire with a low possibility of disconnection and (ii) a method for manufacturing the thin film capacitor as such.

The embodiments discussed in the foregoing description of embodiments and concrete examples serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

The present invention is applicable to (i) a plurality of thin film capacitor parts each of which is constituted by a lower electrode, an insulating layer, and an upper electrode, which are provided on a substrate, and (ii) a method for manufacturing the plurality of thin film capacitor parts. More specifically, the present invention is applicable to pixel auxiliary capacitor parts of a display device. Examples of the display device encompass: an active matrix type liquid crystal display device; an electrophoretic type display; a twisting ball display; a reflective display employing a microscopic prism film; a display employing a light modulation element such as a digital mirror device; a display employing, as a light-emitting element, an element having a variable luminance such as element as an organic EL light emitting element, an inorganic EL light emitting element, and LED (Light Emitting Diode); a field emission display (FED); and a plasma display.

Further, the thin film capacitor parts are usable in a data storage capacitor of a memory cell, such as an image frame memory constituted by integrating DRAMs on a glass substrate.

The invention claimed is:

1. A thin film capacitor comprising:
a plurality of regions each surrounded by a plurality of scanning signal lines and a plurality of data signal lines which perpendicularly intersect with each other on a substrate, the plurality of regions each including one of lower electrodes, a first insulating film, and one of upper electrodes which are provided in this order,
wherein: each connecting wire electrically connects adjacent ones of the upper electrodes to each other, each connecting wire being positioned above the adjacent ones of the upper electrodes and intersecting with one of the data signal lines,
first wires being provided above corresponding ones of the upper electrodes with a second insulating film therebetween, the second insulating film having first contact holes,
the first wires being electrically connected to the respective corresponding ones of the upper electrodes through respective corresponding ones of the first contact holes, and
at least the first wires being used as the connecting wire.

2. The thin film capacitor according to claim 1, wherein each of the upper electrodes is electrically connected to a plurality of upper electrodes, the number of the first wires being provided above corresponding one of the upper electrodes is equal to the number of the plurality of upper electrodes.

3. The thin film capacitor according to claim 1, wherein each of the upper electrodes, which face the lower electrodes corresponding thereto, has a planar outline being inside a planar outline of corresponding one of the lower electrodes.

4. The thin film capacitor according to claim 1, further comprising:
a second wire provided above the first wires with a third insulating film therebetween, the third insulating film having second contact holes,
the second wire running over one of the data signal lines,
each of the first wires being electrically connected to the second wire through corresponding one of the second contact holes,
at least the first wires and the second wire being used as the connecting wire.

5. The thin film capacitor according to claim 4, wherein each of the first contact holes and the corresponding one of the second contact holes are not aligned coaxially to each other.

6. The thin film capacitor according to claim 4, wherein the second wire is provided above a layer in which the data signal lines are provided.

7. The thin film capacitor according to claim 1, wherein each of the first wires is provided below corresponding one of the data signal lines, and is used solely as the connecting wire.

8. The thin film capacitor according to claim 1, wherein the first wires are provided in a same layer as the data signal lines.

9. The thin film capacitor according to claim 1, wherein the first wires are provided between a layer in which the data signal lines are provided and a layer in which the upper electrodes are provided.

10. A display device comprising a thin film capacitor as set forth in claim 1.

11. A memory cell comprising, as a data storage capacitor, a thin film capacitor as set forth in claim 1.

12. A thin film capacitor comprising:
laminated structures each of which is constituted by stacking one of lower electrodes, a first insulating layer, and one of upper electrodes, the laminated structures being provided along a second direction and on both sides of each of signal lines extending along a first direction, the second direction intersecting with the first direction,
the upper electrodes being electrically connected to each other via a corresponding connecting wire provided above the upper electrodes without making contact with edge portions of the laminated structures and the signal lines, the edge portions being opposed to each other along the second direction,
first wires being provided above corresponding ones of the upper electrodes with a second insulating film therebetween, the second insulating film having first contact holes,
the first wires being electrically connected to the respective corresponding ones of the upper electrodes through respective corresponding ones of the first contact holes, and
at least the first wires being used as the connecting wire.

13. A method for manufacturing a thin film capacitor including a plurality of regions each surrounded by a plurality of scanning signal lines and a plurality of data signal lines which perpendicularly intersect with each other on a substrate, the plurality of regions each including: one of lower electrodes, a first insulating film, and one of upper electrodes which are provided in this order, the method comprising:
electrically connecting adjacent ones of the upper electrodes to each other via a corresponding connecting wire which is positioned above the adjacent ones of the upper electrodes and intersects with one of the data signal lines,
providing first wires above corresponding ones of the upper electrodes with a second insulating film therebetween, the second insulating film having first contact holes;
electrically connecting each of the first wires to the corresponding one of the upper electrodes through corresponding one of the first contact holes; and
using at least the first wires as the connecting wire.

14. The method according to claim 13, wherein each of the upper electrodes is electrically connected to a plurality of upper electrodes, the number of the first wires being provided above corresponding one of the upper electrodes is equal to the number of the plurality of upper electrodes.

15. The method according to claim 13, further comprising arranging the upper electrodes, which face respective lower electrodes, such that a planar outline of each of the upper electrodes is inside a planar outline of corresponding one of the respective lower electrodes.

16. The method according to claim 13, further comprising:
providing a second wire above the first wires with a third insulating film therebetween, the third insulating film having second contact holes, the second wire running over one of the data signal lines,
electrically connecting each of the first wires to the second wire through corresponding one of the second contact holes, and
using at least the first wires and the second wire as the connecting wire.

17. The method according to claim 16, wherein the first contact holes and corresponding ones of the second contact holes are provided in such a manner that each of the first contact holes and corresponding one of the second contact holes are not aligned coaxially to each other.

18. The method according to claim 13, wherein each of the first wires is provided below corresponding one of the data signal lines, and is used solely as the connecting wire.

19. A method for manufacturing a display device, the method comprising a method as set forth in claim 13, for manufacturing a thin film capacitor.

20. A method for manufacturing a memory cell, the method comprising, as a method for manufacturing a data storage capacitor, a method as set forth in claim 13, for manufacturing a thin film capacitor.

* * * * *